United States Patent [19]

Ottone et al.

[11] Patent Number: 5,326,177
[45] Date of Patent: Jul. 5, 1994

[54] PERFECTED AIR PAD

[75] Inventors: Renato Ottone, Ivrea; Luigi Piovano, S. Giusto Canavese, both of Italy

[73] Assignee: Pluritec Italia S.p.A., Borgomanero, Italy

[21] Appl. No.: 972,974

[22] Filed: Nov. 6, 1992

[30] Foreign Application Priority Data

Nov. 8, 1991 [IT] Italy .................. TO91A-000857

[51] Int. Cl.⁵ .................................................. F16C 32/06
[52] U.S. Cl. .................................................. 384/12; 384/99
[58] Field of Search .............. 384/12, 99, 122, 306, 384/307, 308

[56] References Cited

U.S. PATENT DOCUMENTS

| | | | |
|---|---|---|---|
| 3,393,648 | 7/1968 | Diehr | 108/102 |
| 3,582,159 | 6/1971 | Uhtenwoldt | |
| 3,855,901 | 12/1974 | Girardi | 90/78 |
| 3,973,810 | 8/1976 | Montag | |
| 4,761,876 | 8/1988 | Kosmowski | 29/568 |
| 4,802,774 | 2/1989 | Pesikov | 384/12 |

FOREIGN PATENT DOCUMENTS 60-196431 10/1985 Japan .
2248892  4/1992 United Kingdom .

Primary Examiner—Lenard A. Footland
Attorney, Agent, or Firm—Ladas & Parry

[57] ABSTRACT

An air pad comprising a body with two opposite faces, and having a number of supporting orifices on one face and at least one compensating orifice on the other face, each compensating orifice being located on a micropad comprising a plate integral with a shank sliding in a cylindrical chamber communicating with the supply conduits of the orifices; and the plates cooperating with a surface opposite the surface of the slideway and located on a bar fitted to the slideway.

13 Claims, 3 Drawing Sheets

PERFECTED AIR PAD

BACKGROUND OF THE INVENTION

The present invention relates to a perfected air pad comprising a body having two opposite faces. More specifically, the present invention relates to an air pad for supporting the work table of a measuring machine or machine tool, e.g. a printed circuit drilling machine.

Known pads of the aforementioned type are widely employed on the slideways of mutually mobile members, by virtue of the low friction coefficient and the straightforward design of the pads. The precision of the slideway depends on the size of the gap between the respective pad and slideway surfaces, which gap decreases in size alongside an increase in the load on the pad. In the presence of light loads and low air supply pressure, even small variations in load result in a considerable variation in the size of the gap, thus impairing the precision of the slideway.

For applications in which the pads are used for supporting the work table of machine tools or measuring machines, which normally feature an air pressure of 2-3 bar, attempts have been made to increase the specific load by constructing extremely heavy tables, which are invariably expensive by virtue of requiring extremely powerful drive means. Even in the case of massive work tables, however, when accelerating or decelerating, the load on the pads varies enormously and differently from one pad to another. The load on the temporarily relieved pads therefore falls drastically, thus varying the gap and resulting in vibration of the table. Further vibration may also be caused by the work holder and/or tool engaging the work.

One design proposal for eliminating such vibration is to connect each air pad to a vibration damper operated solely when accelerating or decelerating. Such pads, however, fail to provide for compensating for variations in load caused by other factors, such as the action of the tool on the work.

Yet another proposal is for a work table which is moved along two axes by means of an intermediate plate made of granite and in turn moving in relation to a fixed slideway also made of granite. An extensive portion of each face of the intermediate plate presents a number of supporting orifices cooperating with a number of vacuum elements for creating a certain preload on the slideway surfaces.

Vacuum preloading as described above presents several drawbacks. Firstly, the preload achievable is relatively low, thus providing for only very limited compensation of the variation in load. Secondly, the number of vacuum elements is necessarily limited, by virtue of requiring a large-section chamber and being located on the same face as the supporting orifices. Finally, the vacuum elements require a number of conduits connected to a vacuum source and distinct from those of the supporting orifices. As such, the supporting system is not only ineffective, but also highly complex and expensive.

SUMMARY OF THE INVENTION

It is an object of the -present invention to provide a perfected air pad of straightforward design, which provides for a high degree of reliability and for eliminating the aforementioned drawbacks typically associated with known supporting systems.

According to the present invention, there is provided an air pad comprising a body having two opposite faces; said body presenting a number of supporting orifices located on one of said faces and supplied with compressed air; characterized by the fact that it comprises at least one compensating orifice supplied with compressed air and located on the other of said faces.

BRIEF DESCRIPTION OF THE DRAWINGS

A preferred non-limiting embodiment of the present invention will be described by way of example with reference to the accompanying drawings, in which.

DETAILED DESCRIPTION OF THE INVENTION

Figure 1:
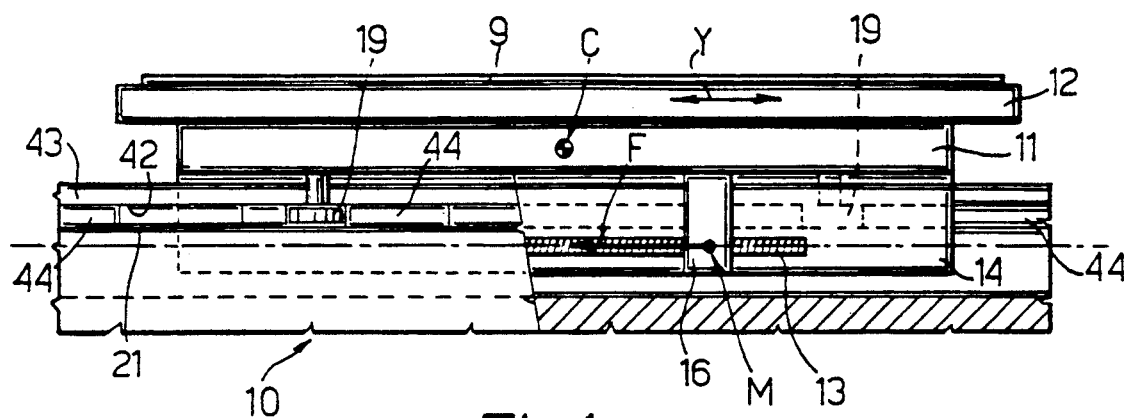
FIG. 1 shows a schematic side view of the work table of a printed circuit drilling machine incorporating air pads in accordance with the present invention.
Figure 2:
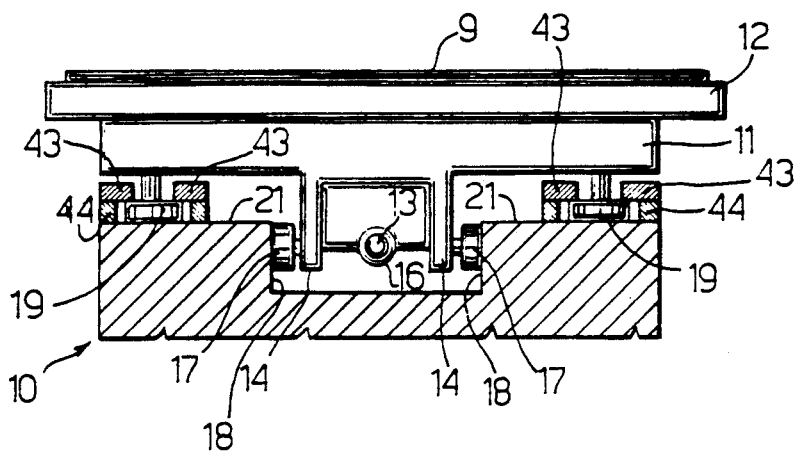
FIG. 2 shows a front view of the FIG. 1 work table.
Figure 3B:
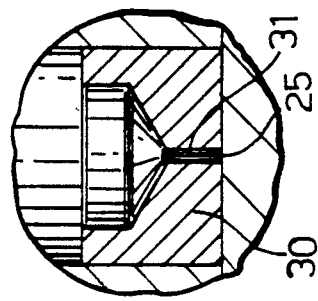
FIG. 3B shows a further enlarged portion of FIG. 3A.
Figure 3A:
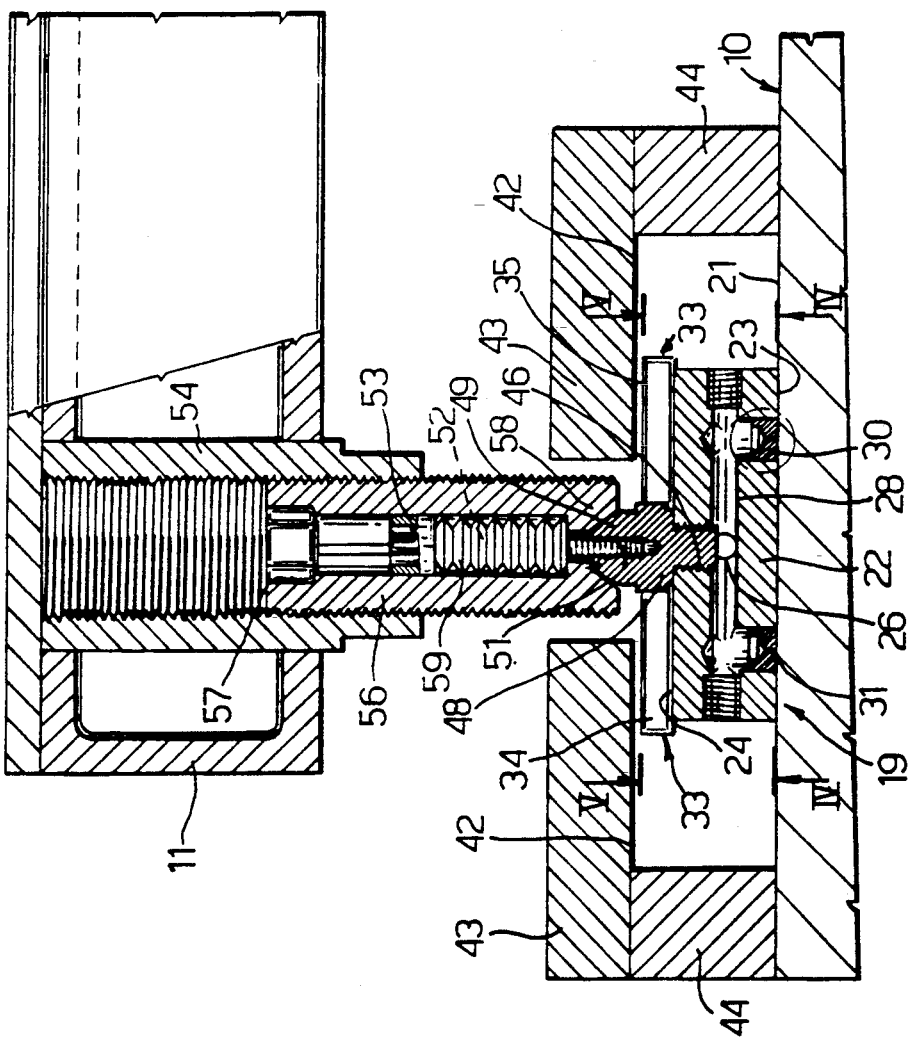
FIG. 3A shows an enlarged, partially sectioned view of a detail in FIG. 2.

Number 10 in FIGS. 1 and 2 indicates the bed of a machine tool, e.g. a drilling machine for printed circuit boards 9. Bed 10 is normally made of granite and constitutes the fixed slideway of a work table 11 fitted in known manner with the usual fixture 12 for fastening boards 9. Table 11 is moved along a given axis, e.g. longitudinal axis Y, by a screw 13 fitted to bed 10 and rotated selectively by a servomotor. Table 11 (FIG. 3) advantageously presents a hollow structure, and is covered by a finish sheet.

Underneath, table 11 presents two longitudinal bars 14 (FIG. 2) between which screw 13 is fitted, and to which is fitted the usual nut screw 16 engaging screw 13. Each bar 14 presents a pair of air pads 17 by which it is guided in sliding manner along the surface of a respective vertical wall 18 of bed 10. By virtue of operating in opposite directions, the action of pads 17 of both bars 14 is compensated automatically.

Each of the four corners of table 11 presents an air pad 19 traveling on an accurately ground guide surface 21 on bed 10. Normally, the weight of table 11 and fixture 12 produces a thrust on each pad 19 equal to a quarter of said weight. When table 11 is subjected to a given amount of acceleration or deceleration, a corresponding force F in the corresponding direction is produced at the connection point M of nut screw 16. Due to the lever arm between the center of gravity C of table 11 and point M, force F produces a thrust which is transmitted to pads 19, and which is subtracted from the weight on pads 19 on the side towards which force F is directed (the left side in FIG. 1), and is added to the weight on pads 19 on the opposite side.

Moreover, when boards 9 are engaged by the work holder or tool, an additional instantaneous force is produced on pads 19, which force is distributed variably on the four pads 19 as a function of the position of table 11 in relation to the machining head, so that each pad 19 is subjected to a different, variable thrust in the course of the machining cycle.

Each pad 19 consists of a cylindrical or prismatic, more specifically, parallelepiped body 22 (FIG. 3A), and presents two opposite parallel faces 23, 24 constituting the two bases of the parallelepipedon. Bottom face 23 presents four shallow grooves 25 (FIG. 4) parallel to its sides and so substantially forming a rectangle, the length of grooves 25, however, being such as to fall short of the corners of the rectangle.

Between faces 23 and 24, body 22 presents a number of conduits comprising a longitudinal conduit 26 (FIG. 5) and three transverse conduits 27, 28 and 29. One of said conduits, e.g. conduit 28, is open outwards and connectable, via a pipe not shown, to a compressed air source; and conduits 27 and 29 are located along the two shorter sides of the rectangle formed by grooves 25.

Bottom face 23 of body 22 presents four supporting orifices 31 (FIGS. 3B and 4), each having its axis perpendicular to face 23 and a diameter preferably of about 0.25 mm, and each preferably formed in a cylindrical insert 30 housed in a respective seat on body 22. Each insert 30 is located at the mid point of a respective side of the rectangle formed by grooves 25, which thus assist in forming the gap between face 23 of pad 19 and guide surface 21. Internally, two orifices 31 communicate with transverse conduit 28 (FIG. 5), and the other two orifices 31 with longitudinal conduit 26, more specifically, at the intersection with conduits 27 and 29.

Figure 4:
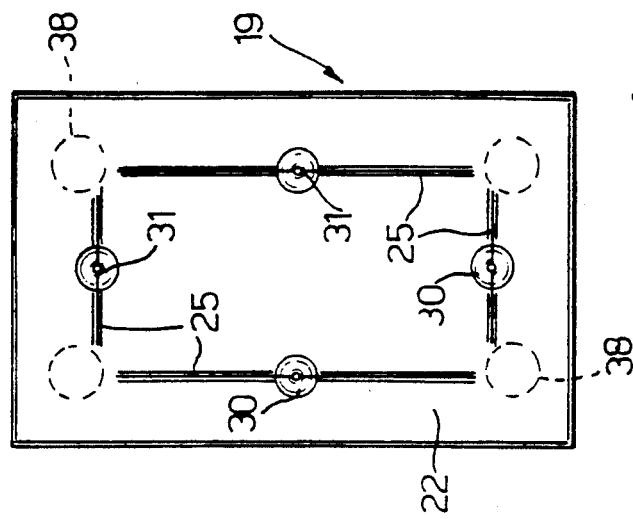
FIG. 4 shows a view of the pad along line IV—IV in FIG. 3.
Figure 5:
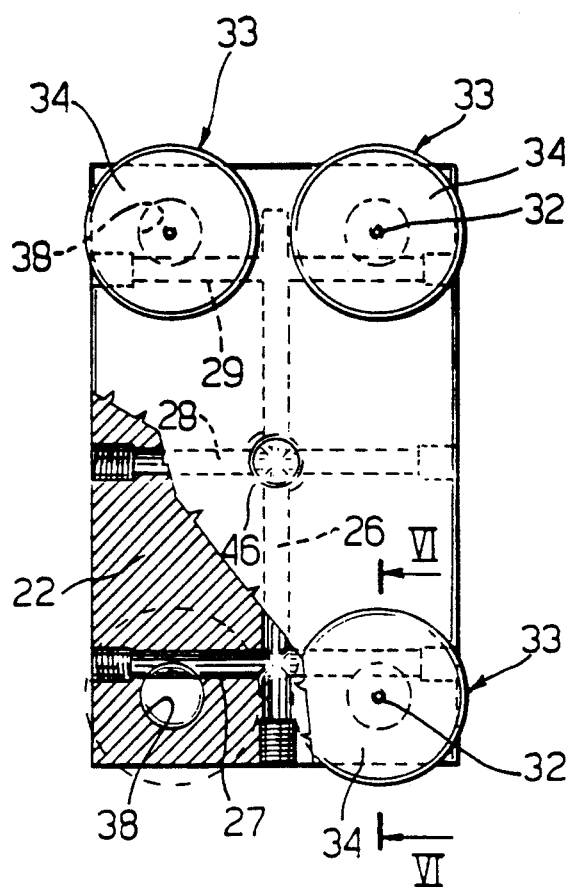
FIG. 5 bows a partially sectioned view of the pad along line V—V in FIG. 3.

According to the present invention, top face 24 of body 22 presents at least one compensating orifice 32 (FIG. 5). Advantageously, provision is made for four orifices 32 having their axis perpendicular to face 24 and of substantially the same diameter as orifices 31 (FIG. 4). Orifices 32 are interspaced with orifices 31, and, more specifically, are located substantially at the four corners of the rectangle formed by grooves 25.

Figure 6:
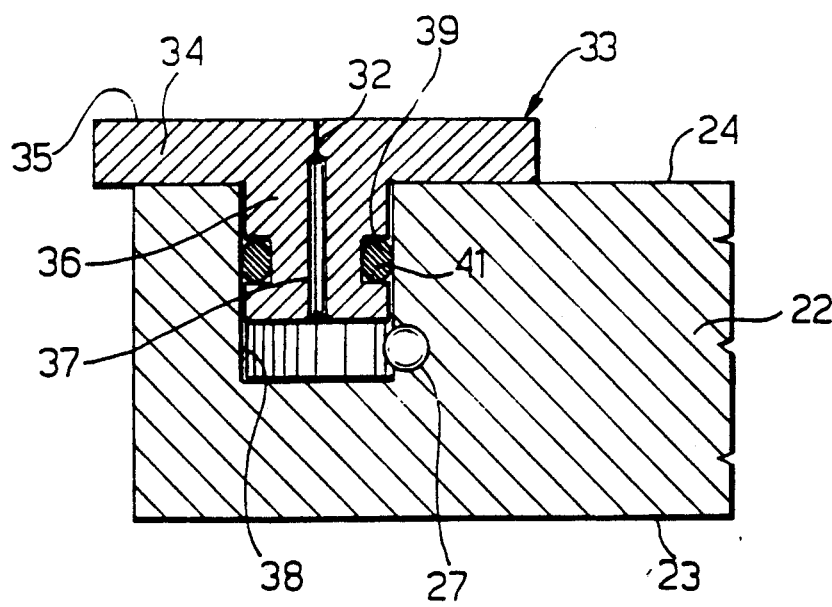
FIG. 6 shows an enlarged section along line VI—VI in FIG. 5.

Each compensating orifice 32 is located on a micropad 33 (FIG. 6) comprising a plate 34 for compensating or preloading pad 19. Plate 34 is circular with a perfectly flat active surface 35, and forms one piece with a cylindrical shank 36 having a conduit 37 coaxial with orifice 32. Conduit 37 connects orifice 32 to a cylindrical chamber 38 in body 22, in which shank 36 slides, and which communicates at the bottom with conduit 27 or 29.

Shank 36 also presents an annular groove 39 housing a seal 41, e.g. of the type known as an 0 ring, for sealing the cylindrical surface of chamber 38. The two pairs of micropads 33 cooperate with two ground contrast surfaces 42 (FIG. 3A) on two straight parallel metal bars 43 fitted longitudinally to bed 10.

More specifically, for each bar 43, bed 10 is fitted with a number of substantially equally-spaced spacer ribs 44 (FIG. 1) to which the respective bar 43 is fitted. The thickness of ribs 44 (FIG. 3A) is slightly greater than the total thickness of body 22 and plate 34, so as to permit a very small amount of axial travel of plate 34.

The section of shank 36 is so sized that, when pad 19 is supplied with compressed air, the thrust produced by the air in chamber 38 does not exceed the lift of micropad 33, i.e. the thrust produced by the air from orifice 32 in the gap between surface 35 of micropad 33 and surface 42 of bar 43. In turn, surface 35 of plate 34 is so sized that the four micropads produce a thrust ranging from ⅛ to ¼ of the static weight supported by pad 19.

Top face 24 of body 22 also presents a threaded hole 46 possibly extending as far as conduits 26 and 28, and in which is screwed the threaded end of an element 48 for connection to table 11. Element 48 presents a head 49 having a threaded hole in which is screwed the threaded end 51 of a stud 52 having a larger-diameter socket head 53.

Table 11 in turn presents, substantially at each of its four corners, an internally threaded sleeve 54 in which is fitted a counterelement, consisting of a hollow cylinder 56, for connection to pad 19. Cylinder 56 is threaded externally, and presents a socket head 57 at the top for screwing it inside sleeve 54.

Cylinder 56 is designed to house pin 52, and presents a bottom wall 58 having a central hole enabling passage of the threaded end 51 of pin 52. Between wall 58 of cylinder 56 and head 53 of pin 52, there is provided a Belleville washer compression spring 59 so sized as to withstand at all times the weight of table 11 and fixture 12, and the additional thrust produced under normal operating conditions.

Finally, head 49 of element 48 presents a semispherical upper surface engaging a conical surface formed coaxially in bottom wall 58 of cylinder 56. Between pad 19 and table 11, there is thus formed a spherical articulated joint enabling self-adaption of the connection.

Compensated air pad 19 operates as follows.

When idle, surface 23 of body 22 of each pad 19 is held contacting guide surface 21 of bed 10 by table 11 via joint 48-56; and micropads 33, for lack of compressed air to support them, are set to the lowered position with a gap between plates 34 and bars 43. Conversely, when pad 19 is supplied with compressed air, the air inside chambers 38 (FIG. 6) acts on shanks 36 so as to immediately move plates 34 towards bars 43 (FIG. 3); and the compressed air issuing from orifices 31 now creates a supporting gap between bottom surface 23 of body 22 and guide surface 21 of bed 10, so that pads 19 hover over guide surfaces 21.

Moreover, compressed air also issues through conduits 37 (FIGS. 3A, 6) from orifices 32 of micropads 33, for preventing surface 35 of plates 34 from contacting the bottom surface 42 of respective bars 43. A compensating gap is thus formed between surfaces 35 and 42, which gap produces a given thrust which is added to the resultant of the weight and thrust exerted by table 11 on pad 19, which thus behaves as though it were preloaded, i.e. subjected to a greater load.

As we know, the thrust of an air pad depends on the air pressure of the orifices and the size of the active surface of the pad, and varies in inverse proportion to the pressure of the compressed air supply to the pad. The size of the gap varies alongside the load on the pad. Curve 61 in the FIG. 7 graph shows in mm, and as a function of load, the supporting gap size of a pad similar to pad 19, supplied with compressed air at 4 bar pressure, but having no compensating micropads 33. As can be seen, the variation in the size of the gap is minimum for loads of over 10 kg, whereas, for loads of less than 10 kg, it moves rapidly from a few tens of a um to values of the order of a tenth of a um.

Curve 62 shows the supporting gap size of pad 19 compensated by means of four micropads 33 with a preload thrust of roughly 10 kg. As can be seen, the variation in the size of the gap is minimum even in the case of loads approaching zero, as when accelerating or decelerating sharply, so that table 11 is subjected to no vibration, and remains perfectly stable under all operating and load conditions.

Figure 7:
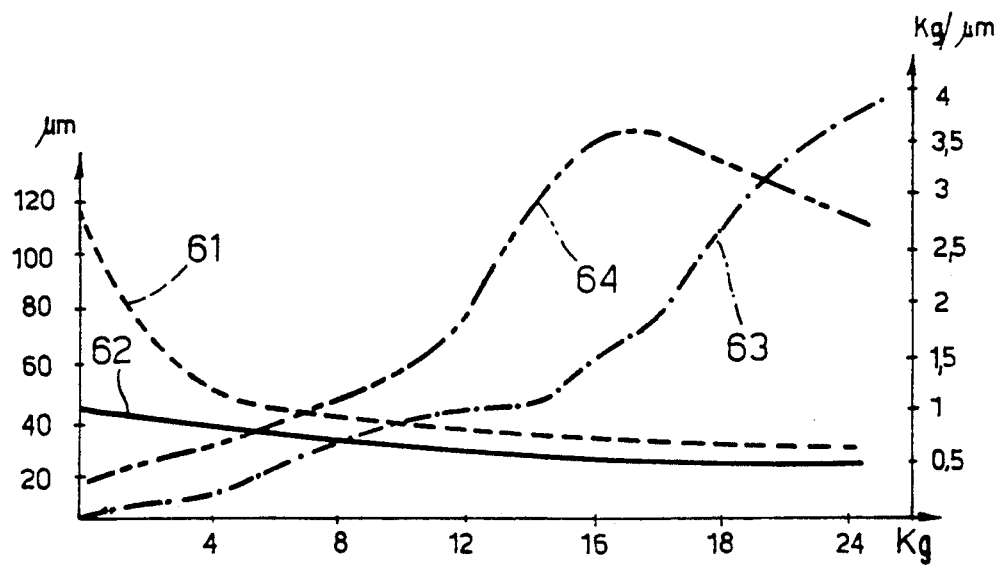
FIG. 7 shows a performance graph of the pad.

FIG. 7 also shows two curves illustrating the rigidity of the pad as a function of load, rigidity here being intended to mean the load to gap size ratio expressed in kg/um on the scale to the right. Curve 63 shows the rigidity of the noncompensated pad, and curve 64 the rigidity of the pad when compensated. As can be seen, to achieve the same rigidity as the compensated pad, the noncompensated pad must be loaded to at least approximately 20 kg, whereas the same degree of rigidity is achieved on the compensated pad with a load of barely 14 kg.

The advantages of air pad 19 according to the present invention will be clear from the foregoing description. In particular, as compared with noncompensated pads, pad 19 provides for reducing the weight of the work table, and consequently for proportionally reducing the size of the table motor and so increasing the pressure of the compressed air supply to the pads. Moreover, it provides for more or less eliminating any vibration caused by variations in the size of the supporting gap when accelerating or decelerating or due to engagement of the work by the work holder or tool. Finally, even as compared with vacuum preloading systems, the pad according to the present invention provides for more effective compensation, as well as for supplying supporting and compensating orifices 31 and 32 from the same operating fluid source.

To those skilled in the art it will be clear that changes may be made to the air pad as described and illustrated herein without, however, departing from the scope of the present invention. For example, changes may be made to the number of supporting and/or compensating orifices; pads 19 may advantageously be derived from noncompensated pads, such as pads 17 (FIG. 2); micropads 33 may be other than circular in design; and pads 19 may be applied to the tables of other precision machines, e.g. measuring machines, or to other members traveling along respective slideways.

We claim

1. An air pad for supporting a first member in relation to a second member, said members being mutually slidable, said pad comprising a body having two opposite faces, said body being provided with a number of supporting orifices located on one of said faces and supplied with compressed air, at least one compensating orifice being associated with the other of said faces and being supplied with compressed air, said body being removably connected to said first member, said second member comprising two contrast surfaces facing said two faces, wherein the improvement comprises a micropad provided with said compensating orifice and movable in relation of said body in a direction parallel to the axis of said compensating orifice, each one of said contrast surfaces constantly covering the orifices of the relevant facing face, said micropad being urged by compressed air toward the contrast surface facing said other face, said micropad having an active surface so sized as to cause said compensating orifice to generate a preload to compensate any variation on the load on said pad occurring during the mutual sliding of said members.

2. An air pad for supporting a work table of a machine tool slidably mounted on a fixed straight slideway, said pad comprising a body having two opposite parallel faces, said body being provided with a number of supporting orifices located on one of said faces and supplied with compressed air, at least one compensating orifice supplied with compressed air and carried by a micropad provided on to the other of said faces and movably mounted on said body, said body being removably connected to said work table by an adjustable joint, said slideway comprising two contrast surfaces facing said two faces, each one of said contrast surfaces constantly covering the orifices of the relevant facing face, said micropad being urged toward the relevant contrast surface and being so sized as to generate a preload to compensate any variation on the static and dynamic load on said pad occurring during the sliding of said table.

3. A pad as claimed in claim 2, wherein said micropad is movable in relation to said body parallel to the axis of said compensating orifice, said micropad being urged by compressed air toward said relevant contrast surface.

4. A pad as claimed in claim 3, wherein:
said micropad (33) comprises a plate (34) integral with cylindrical shank (36) sliding in a seat (38) formed in said body (22) and supplied with compressed air; said shank (36) has an annular groove (39) housing a seal (41) for sealing said seat (38); and said compensating orifice (32) communicates with said seat (38) via a conduit (37) in said shank (36).

5. A pad as claimed in claim 4, wherein said supporting orifices (31) and said seat (38) are supplied with compressed air by a common set of conduits (26-29) located in said body (22); said plate (34) having an active surface (35) so sized as to provide a preload ranging from ⅓ to ⅔ of the load of the pad.

6. A pad as claimed in claim 4, wherein the section of said shank (36) is so sized as to enable the compressed air to move said micropad (33) towards a contrast surface (42).

7. A pad as claimed in claim 4 wherein said body (22) is cylindrical or prismatic with bases forming said faces (23, 24), each of said supporting orifices (31) having its axis perpendicular to said locating face (23), rectilinear shallow grooves (25) being provided on said locating face (23) in respective correspondence with said supporting orifices (31), and further comprises a number of compensating orifices (32) equal to said number of said supporting orifices (31), said compensating orifices (32) having respective micropads and substantially a same diameter as said supporting orifices (31).

8. A pad as claimed in claim 7, wherein said body (22) is parallelepiped, and comprises four supporting orifices (31) interspaced with the same number of compensating orifices (32).

9. A pad as claimed in claim 8, wherein said supporting orifices (31) are located at respective midpoints of sides of a rectangle defined on said locating face (23) by said shallow grooves (25), but said shallow grooves (25) not reaching corners of said rectangle, said compensating orifices (32) being located at said corners.

10. A pad as claimed in claim 9, wherein one of said surfaces (21, 42) consists of the upper surface (21) of a granite guide block (10); the other of said surfaces (21, 42) being formed on a pair of parallel metal bars (43) fitted to said block (10) by spacing means (44).

11. A pad as claimed in claim 10, wherein for each said metal bar (43), said spacing means comprise a number of ribs (44) fitted a predetermined distance apart to said block (10) and said metal bar (43).

12. A pad as claimed in claim 2, wherein said joint (48, 56) is an elastic joint, and comprises an element (48)

fitted to said body (22), a counterelement (56) fitted to said first member (11), and a compression spring (59) for pressing said counterelement (56) on to said element (48).

13. A pad as claimed in claim 12, wherein said joint (48, 56) also comprises a semispherical head (49) on said element (48), and a conical surface on said counterelement (56); said compression spring (59) being a Belleville washer type and being located between a cylindrical cavity of said counterelement (56) and a stud (52) housed in said cylindrical cavity.

* * * * *